United States Patent [19]
Kikuchi et al.

[11] Patent Number: 5,847,438
[45] Date of Patent: Dec. 8, 1998

[54] BONDED IC SUBSTRATE WITH A HIGH BREAKDOWN VOLTAGE AND LARGE CURRENT CAPABILITIES

[75] Inventors: Hiroaki Kikuchi; Tomohiro Hamajima, both of Tokyo, Japan

[73] Assignee: NEC Corporation, Tokyo, Japan

[21] Appl. No.: 625,127

[22] Filed: Apr. 1, 1996

[30] Foreign Application Priority Data

Mar. 31, 1995 [JP] Japan .................................. 7-075130

[51] Int. Cl.⁶ .......................... H01L 29/00; H01L 29/76; H01L 31/036; H01L 31/112
[52] U.S. Cl. .............................. 257/518; 257/66; 257/67; 257/505; 257/510; 257/551; 257/517; 438/427
[58] Field of Search ................................ 257/65–70, 374, 257/505, 510, 511, 517, 518, 524; 437/974; 438/427

[56] References Cited

U.S. PATENT DOCUMENTS

| | | | |
|---|---|---|---|
| 4,982,266 | 1/1991 | Chatterjee | 257/374 |
| 5,097,314 | 3/1992 | Nakagawa et al. | 257/517 |
| 5,397,912 | 3/1995 | Sundaram | 257/518 |

FOREIGN PATENT DOCUMENTS

| | | |
|---|---|---|
| 0323549 | 7/1989 | European Pat. Off. . |
| HEI-3 142952 | 6/1991 | Japan . |

OTHER PUBLICATIONS

"High Voltage, New Driver IC Technique Based on Silicon Wafer Direct–Bonding (SDB)," Akio Nakagawa et al, 1988 IEEE, PESC '88 Record (Apr. 1988), pp. 1325–1329.

Primary Examiner—Mahshid D. Saadat
Assistant Examiner—Allan R. Wilson
Attorney, Agent, or Firm—Laff, Whitesel, Conte & Saret, Ltd.

[57] ABSTRACT

A semiconductor device includes a groove formed in a surface of a first semiconductor substrate of one conductivity type in order to partition and isolate first and second device regions. A first insulating film on the first semiconductor substrate of the first device region also contacts the groove. A second insulating film covers an inner wall of the groove. The first insulating film is thicker than the second film in order to increase the breakdown voltage and facilitate carrying a higher current. This thickness relationship also aids manufacturing.

3 Claims, 6 Drawing Sheets

BONDED IC SUBSTRATE WITH A HIGH BREAKDOWN VOLTAGE AND LARGE CURRENT CAPABILITIES

BACKGROUND OF THE INVENTION

1. Field of the Invention

The present invention relates to a semiconductor device and a method of manufacturing the same and, more particularly, to a high-breakdown-voltage, large-current power IC using a bonded substrate and a method of manufacturing the same.

2. Description of the Prior Art

In recent years, a substrate bonding method has been improved in junction properties and used in a variety of applications as a method of fabricating a substrate having a multilevel film structure such as an SOI substrate. Particularly, various SOI substrates can be manufactured by applying this method. The SOI substrates are put into practical use in high-breakdown-voltage devices for power control. In addition, the SOI substrates are expected for high-speed operations with low voltages, so that they receive a great deal of attention as substrate materials for next-generation CMOS devices.

Today, in the field of power elements, to realize highly integrated, highly functional, highly reliable devices, an intelligent power IC in which a high-breakdown-voltage power device using a relatively large current, and a low-breakdown-voltage control circuit element are formed on a single chip has been developed. To increase the driving current amount of the power device in this intelligent power IC, a vertical power device is required in which a source and a gate are formed on one surface where control circuits are to be formed, and a drain is formed on an opposite surface. That is, the power device and the control circuits must be electrically isolated from each other.

Figure 1:
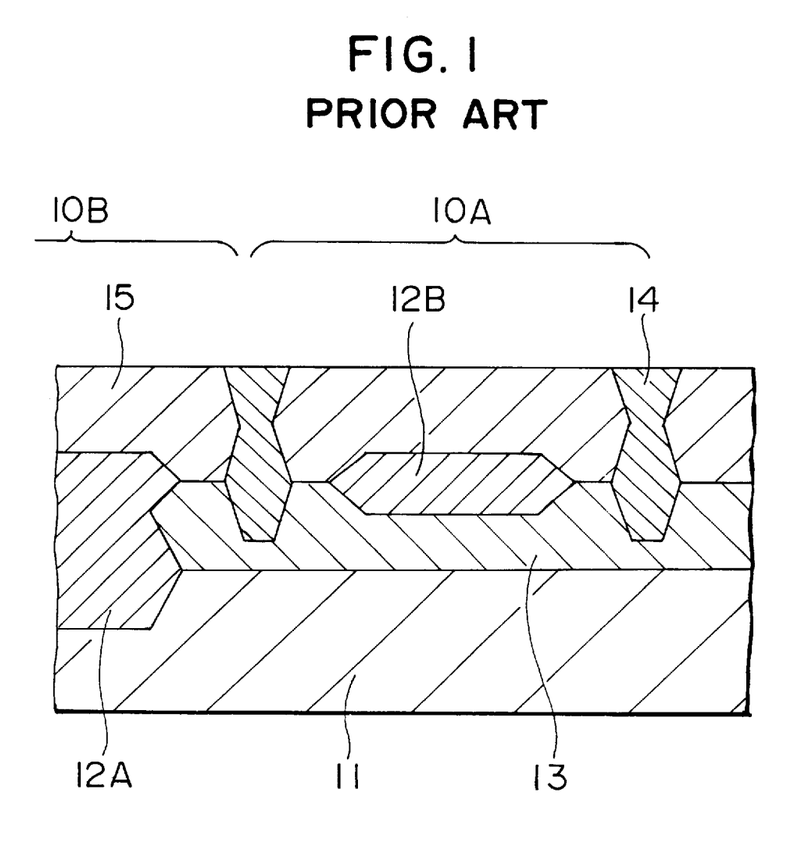
FIG. 1 is a sectional view for explaining a conventional p-n junction isolation scheme using an epitaxial technique.

Isolation of elements in the intelligent power IC having this vertical power device is conventionally performed by a p-n junction isolation scheme using an epitaxial technique, as shown in FIG. 1. More specifically, an $n^+$-type buried layer 12A is formed in a silicon substrate 11, and then a p-type epitaxial layer 13 is formed. An $n^+$-type buried layer 12B and the lower portions of $p^+$-type diffusion layers 14 are formed, and an n-type epitaxial layer 15 is formed. Thereafter, the upper portions of the $p^+$-type diffusion layers 14 are formed. The n-type epitaxial layer partitioned and isolated by the p-type epitaxial layer 13 and the $p^+$-type diffusion layers 14 is defined as a first functional-device formation region 10A, and the remaining portion is defined as a second functional-device formation region 10B. By this p-n junction isolation scheme, however, it is difficult to manufacture an intelligent power IC with a power device having a breakdown voltage of 100 V or more.

By using a substrate bonding technique as a countermeasure against this, an intelligent power IC with a power device having a breakdown voltage of 100 V or more can be manufactured. This manufacturing method is disclosed in, e.g., Japanese Unexamined Patent Publication No. 3-142952, and will be described below with reference to FIGS. 2A to 2C.

Figure 2A:
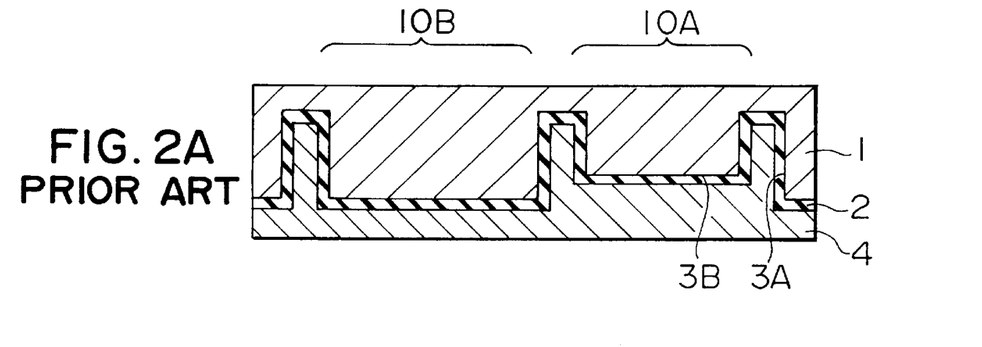
FIGS. 2A to 2C are sectional views respectively showing the sequential steps of a semiconductor chip in order to explain a prior art related to a substrate bonding technique.
Figure 2B:
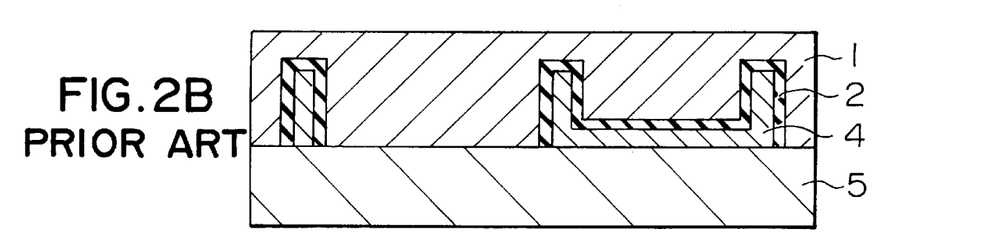
Figure 2C:
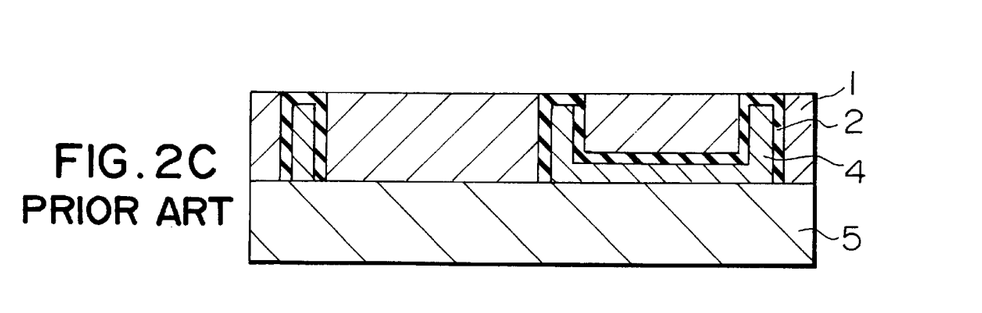

As shown in FIG. 2A, first deep grooves 3A and a second shallow groove 3B are formed in a first monocrystalline silicon substrate 1, and the inner walls of the grooves 3A and 3B are oxidized to form silicon oxide films 2. A polysilicon film 4 is formed on the entire surface including the grooves 3A and 3B to fill the grooves 3A and 3B. Next, as shown in FIG. 2B, the surface of the polysilicon film 4 is ground and polished to expose the surface of the first monocrystalline silicon substrate 1 at a portion except for the groove portions. Then, the resultant surface is joined to the mirror-polished surface of a second monocrystalline silicon substrate 5 having at least one mirror-polished surface. As shown in FIG. 2C, the other surface of the first monocrystalline silicon substrate 1 is ground and polished to expose the first groove 3A. Thereafter, a first functional-device formation region 10A partitioned by the first grooves 3A and electrically isolated by the silicon oxide films 2, and a second functional-device formation region 10B adjacent thereto are formed.

Figure 3:
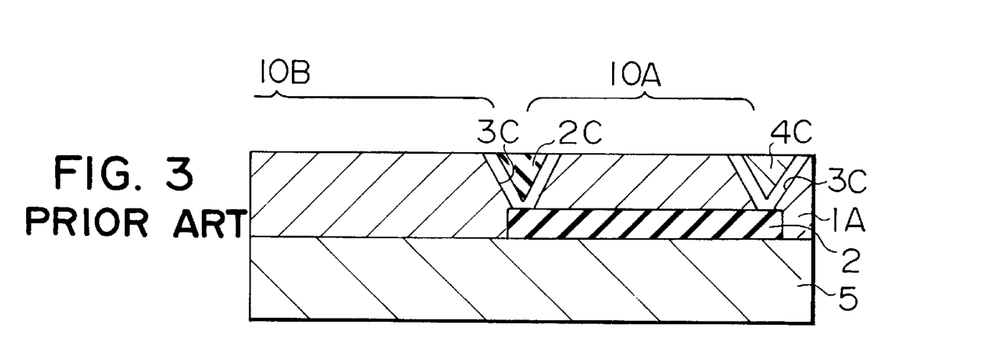
FIG. 3 is a sectional view showing another prior art related to the substrate bonding technique.

As a method of manufacturing an intelligent power IC by using the substrate bonding technique, the following method is also put into practical use. That is, a silicon oxide film 2 is formed in a predetermined region on a first monocrystalline silicon substrate 1, and planarized. A second monocrystalline silicon substrate 5 is joined to this planarized surface. The other surface of the first monocrystalline silicon substrate 1 is ground and polished to a predetermined thickness. Grooves 3C which reach the silicon oxide film 2 are formed. Then, each groove 3C is filled with a silicon oxide film 2C and a polysilicon film 4C. In this method, however, in forming the grooves 3C, a large mask alignment margin is disadvantageously required.

In each of the above-described conventional methods of manufacturing semiconductor devices by using groove isolation, the junction surface of the first monocrystalline silicon substrate is a mixed surface in which the monocrystalline silicon film and the silicon oxide film are present, or a mixed surface in which the monocrystalline silicon film, the silicon oxide film, and the polysilicon film are present. Since the polishing rates of these materials are different, it is difficult to planarize the junction surface by polishing. Non-adhesive portions (voids) are formed at the junction interface upon joining to the second monocrystalline silicon substrate. Particularly in the second functional-device formation region where a vertical power device such as a VDMOS is to be formed, a current flows through the junction interface. For this reason, formation of voids may increase the electric resistance, greatly affecting device characteristics.

The present inventor examined a step remaining on the mixed surface formed by the method described in each prior art to obtain a height of about 20 nm. By these manufacturing methods, it is difficult to form a smooth mixed surface capable of a perfect junction free from formation of voids.

SUMMARY OF THE INVENTION

The present invention has been made in consideration of the above situation in the prior arts, and has as its object to solve the above problem and provide a semiconductor device using a bonded substrate having a perfect junction interface free from a non-adhesive region such as a void, and a method of manufacturing the same.

To achieve the above object, according to the first aspect of the present invention, there is provided a semiconductor device comprising a groove formed in a surface of a first semiconductor substrate of one conductivity type to partition and isolate first and second functional-device formation regions, a first insulating film which is formed on the surface of the first semiconductor substrate in the first functional-device formation region and contacts the groove, a second insulating film for covering an inner wall of the groove, a filling layer formed on the second insulating film to fill the groove, a polysilicon film of one conductivity type formed on an entire surface including the first insulating film which appears on the surface of the first semiconductor substrate, the second insulating film, and the filling layer, and having a planarized surface, a second semiconductor substrate of one conductivity type joined to the planarized surface of the polysilicon film, a first functional device formed on the first semiconductor substrate in the first functional-device formation region electrically insulated and isolated by the first insulating film, the second insulating film, and the filling layer, and a second functional device formed on the first and second semiconductor substrates in the second functional-device formation region.

The second insulating film described in the first aspect may be constituted by a silicon oxide film and a silicon nitride film.

According to the second aspect of the present invention, there is provided a semiconductor device comprising a first deep groove formed in a surface of a first semiconductor substrate of one conductivity type to partition and isolate first and second functional-device formation regions, a second sallow groove which is formed in the surface of the first semiconductor substrate in the first functional-device formation region and contacts the first groove, an insulating film for covering inner walls of the first and second grooves, a filling layer formed on the insulating film to fill the first and second grooves, a polysilicon film of one conductivity type formed on an entire surface including the insulating film which appears on the surface of the first semiconductor substrate, and the filling layer, and having a planarized surface, a second semiconductor substrate of one conductivity type joined to the planarized surface of the polysilicon film, a first functional device formed on the first semiconductor substrate in the first functional-device formation region partitioned by the first and second grooves and electrically insulated and isolated by the insulating film, and a second functional device formed on the first and second semiconductor substrates in the second functional-device formation region.

According to the third aspect of the present invention, there is provided a method of manufacturing a semiconductor device having the steps of selectively providing an insulating film on a surface of a first semiconductor substrate of one conductivity type, forming a polysilicon film on an entire surface including the insulating film to planarize a surface of the polysilicon film by grinding and polishing, and joining a second semiconductor substrate of one conductivity type to the planarized surface of the polysilicon film, comprising the steps of doping an impurity of one conductivity type in the polysilicon film after planarizing the surface of the polysilicon film by grinding and polishing, and polishing and planarizing the surface of the polysilicon film in which the impurity is doped.

According to the present invention having the above aspects, the polysilicon film is formed on a mixed surface, including the monocrystalline silicon substrate and the polysilicon film, of the monocrystalline substrate. After the surface of the polysilicon film is ground and polished, an impurity is doped therein, and the surface is further polished. Therefore, a semiconductor device constituted by the monocrystalline substrate free from formation of voids on the junction interface, and having a perfect junction and electrical continuity in a direction vertical to the junction interface, and a method of manufacturing the same can be obtained.

The above and other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

Preferred embodiments of the present invention will be described in detail below with reference to the accompanying drawings.

Figure 4:
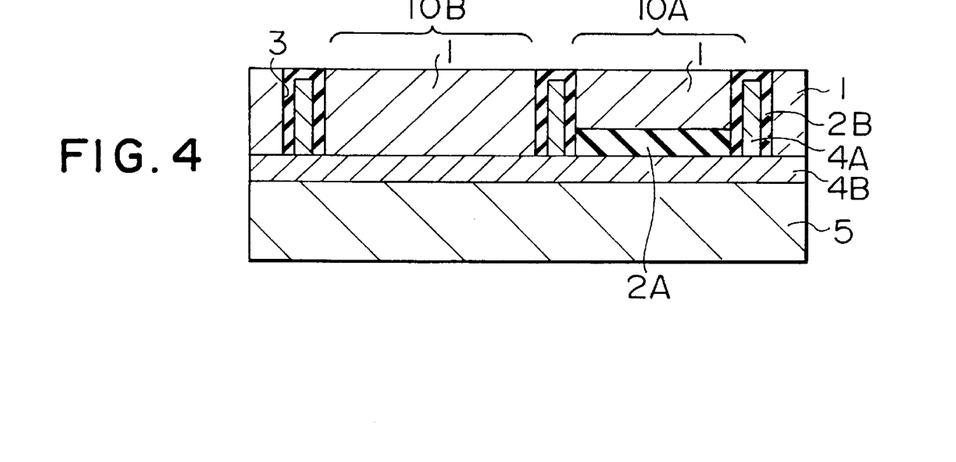
FIG. 4 is a sectional view showing the first embodiment of the present invention.
Figure 5A:
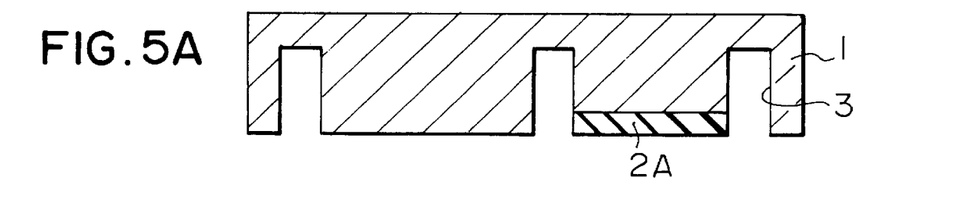
FIGS. 5A to 5C are sectional views respectively showing the sequential steps of a semiconductor chip in order to explain a manufacturing method of the first embodiment shown in FIG. 4.
Figure 5B:
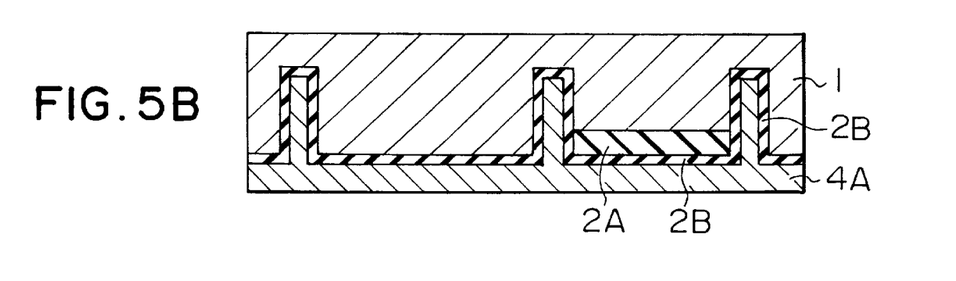
Figure 5C:
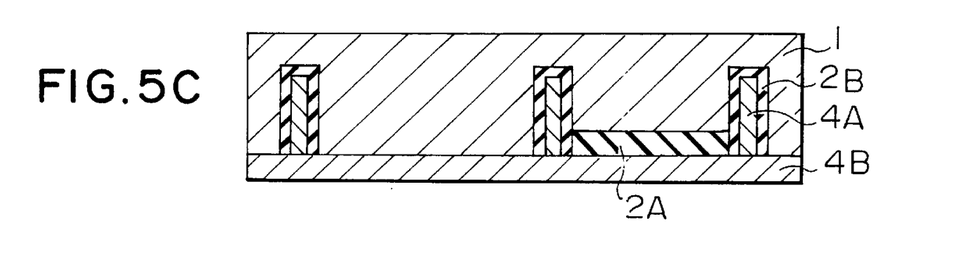

FIG. 4 is a sectional view showing the first embodiment of the present invention. FIGS. 5A to 5C are sectional views respectively showing the sequential steps of a manufacturing method for the first embodiment, and this manufacturing method will be explained first.

As shown in FIG. 5A, a first n-type monocrystalline silicon substrate 1 having a thickness of about 600 $\mu$m and a resistivity of about 1 $\Omega$cm is prepared. A first silicon oxide film 2A having a thickness of about 1 $\mu$m is formed on part (first functional-device formation region) of one major surface of the first monocrystalline silicon substrate 1 by localized oxidation of silicon (LOCOS), and its surface is polished and planarized. Note that a shallow groove may be formed, and the first silicon oxide film may be formed. Then, 8-$\mu$m deep grooves 3 for partitioning first and second functional-device formation regions 10A and 10B are formed in the surface of the first monocrystalline silicon substrate 1 adjacent to the first silicon oxide film 2A by RIE (Reactive Ion Etching).

As shown in FIG. 5B, the first monocrystalline silicon substrate 1 is thermally oxidized to form a second silicon oxide film 2B having a thickness of about 0.1 $\mu$m on the surface including the grooves 3. A first polysilicon film 4A is grown on the surface of the first monocrystalline silicon substrate 1 by CVD to have a thickness of about 2 μm and fill each groove 3.

As shown in FIG. 5C, the surface of the first polysilicon film 4A is polished until the surface of the first monocrystalline silicon substrate 1 is exposed. A second fine polysilicon film 4B is grown to a thickness of about 2 μm on the polished surface of the first monocrystalline silicon substrate 1 by CVD at a low temperature of about 650° C. The surface of the second polysilicon film 4B is polished and planarized to reduce small corrugations remaining on the surface to 10 nm or less.

Then, as shown in FIG. 4, a second n-type monocrystalline silicon substrate 5 having a thickness of about 600 μm and a resistivity of 0.01 to 0.02 Ωm is prepared. One major surface of the second monocrystalline silicon substrate 5 and the surface of the second polysilicon film 4B on the first monocrystalline silicon substrate 1 are caused to face each other and joined in the outer air at room temperature. The resultant structure is thermally treated at 1,100° to 1,200° C. for about two hours in order to make the junction firm. Thereafter, the non-junction surface of the first monocrystalline silicon substrate 1 is ground and polished until the second silicon oxide film 2B on the bottom of each groove 3 is exposed, thereby partitioning and isolating the first and second functional-device formation regions 10A and 10B. A protective or control device is formed in the first functional-device formation region 10A electrically insulated and isolated by the first and second silicon oxide films 2A and 2B. On the other hand, a vertical power device is formed in the second functional-device formation region where the first and second monocrystalline silicon substrates 1 and 5 are joined to each other through the second polysilicon film 4B. In this manner, an intelligent power IC is manufactured.

Note that the second polysilicon film 4B is made conductive when an n-type impurity heavily doped in the second monocrystalline silicon substrate 5 serving as a support substrate and used as the drain electrode of the power device is diffused during a thermal treatment in joining substrates or during a thermal treatment in the manufacturing process of a semiconductor device. Owing to this conductivity, the loss of a drain current in the vertical VDMOS can be reduced. When, however, the thickness of the second polysilicon film 4B is large (1 μm or more), an impurity is preferably doped in the second polysilicon film 4B in advance because the impurity diffused from the second monocrystalline silicon substrate 5 is insufficient.

There are two methods therefor. According to the first method, an n-type impurity such as phosphorus, arsenic, or antimony is doped in the second polysilicon film 4B by solid-phase diffusion, vapor-phase diffusion, or ion implantation before grinding and polishing the second polysilicon film 4B, as shown in FIG. 5C. According to the second method, an n-type impurity such as phosphorus, arsenic, or antimony is doped in the second polysilicon film 4B by solid-phase diffusion, vapor-phase diffusion, or ion implantation after grinding and polishing the second polysilicon film 4B. However, in the first method, an increase in polishing rate of the polysilicon film makes it difficult to control the thickness and flatness of the polysilicon film in some case. In the second method, a non-adhesive portion is easily formed in a bonding step due to a rough surface of the polysilicon film. The present invention, therefore, employs a method in which an n-type impurity such as phosphorus, arsenic, or antimony is doped in the second polysilicon film 4B by solid-phase diffusion, vapor-phase diffusion, or ion implantation after grinding and polishing the second polysilicon film 4B, and the second polysilicon film 4B including this impurity is polished to planarize its surface. The dose of the impurity in the second polysilicon film 4 is set such that the resistivity of the second polysilicon film is almost equal to that of the second monocrystalline silicon substrate 5. When the first monocrystalline silicon substrate and the second monocrystalline silicon substrate are of a p-type conductivity, boron is doped.

Figure 6:
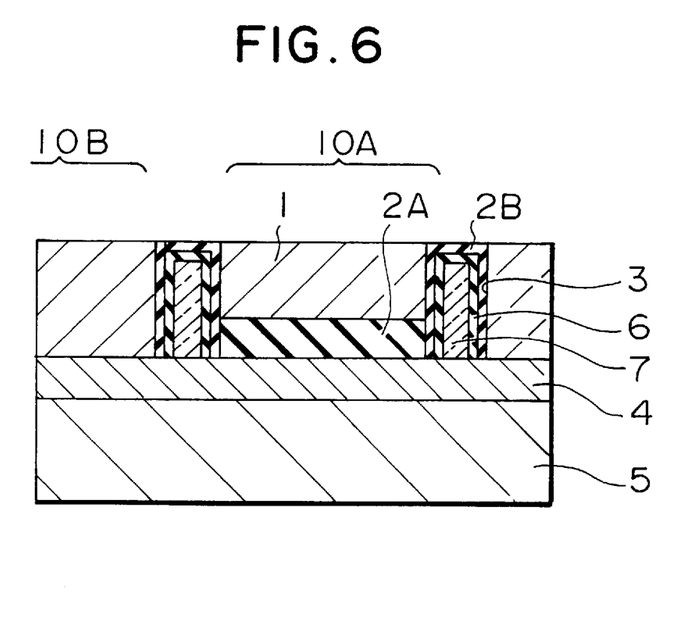
FIG. 6 is a sectional view showing the second embodiment of the present invention.

FIG. 6 is a sectional view showing the second embodiment of the present invention. As in the first embodiment, a first silicon oxide film 2A and grooves 3 are formed on and in the surface of a first monocrystalline silicon substrate 1, and then a second silicon oxide film 2B and a silicon nitride film 6 are formed on the entire surface. Thereafter, a BPSG film 7 is grown to have a thickness of about 2 μm and fill each groove 3. The BPSG film 7, the silicon nitride film 6, and the second silicon oxide film 2B are polished to expose the surface of the first monocrystalline silicon substrate. As in the case of FIG. 4, a polysilicon film 4 is formed on the surface of the first monocrystalline silicon substrate 1, and its surface is polished and planarized. A second monocrystalline silicon substrate 5 is joined to the planarized surface of the polysilicon film 4. The resultant structure is thermally treated. The non-junction surface of the first monocrystalline silicon substrate 1 is ground and polished until the second silicon oxide film 2B on the bottom of each groove is exposed, thereby partitioning first and second functional-device formation regions 10A and 10B. A device is formed in each region to manufacture a semiconductor device having the same structure as in FIG. 4. In the second embodiment, since the BPSG film is used as a filler for the groove 3, the groove is easily filled, compared to the first embodiment. Note that a PSG film may be used instead of the BPSG film.

Figure 7:
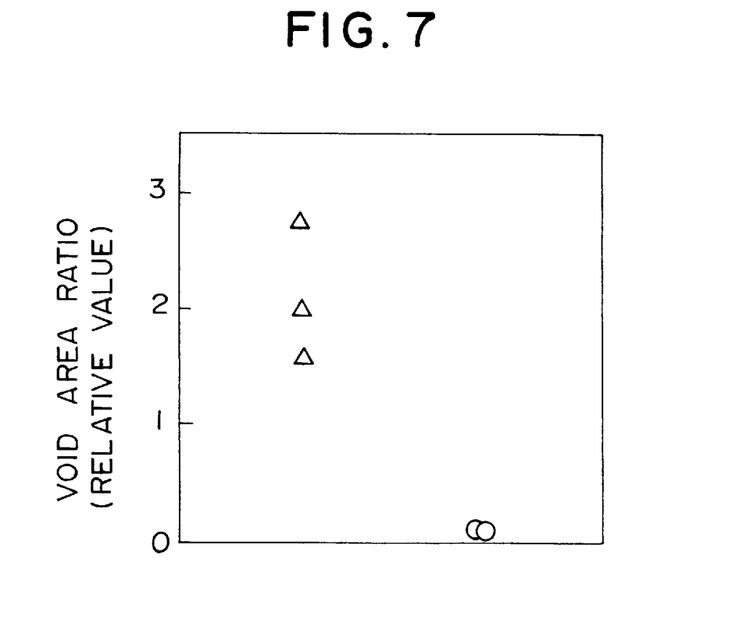
FIG. 7 is a graph showing comparison of the void area ratios in the embodiments of the present invention and the prior arts.

FIG. 7 is a graph showing comparison of the void area ratios (relative values) of power IC bonded substrates respectively fabricated by the first and second embodiments of the present invention, and the prior arts shown in FIG. 1 (○ represents the void area ratios of the embodiments of the present invention, and Δ represents those of the prior arts). As is apparent from FIG. 7, according to the embodiments, almost no void is formed.

Figure 8:
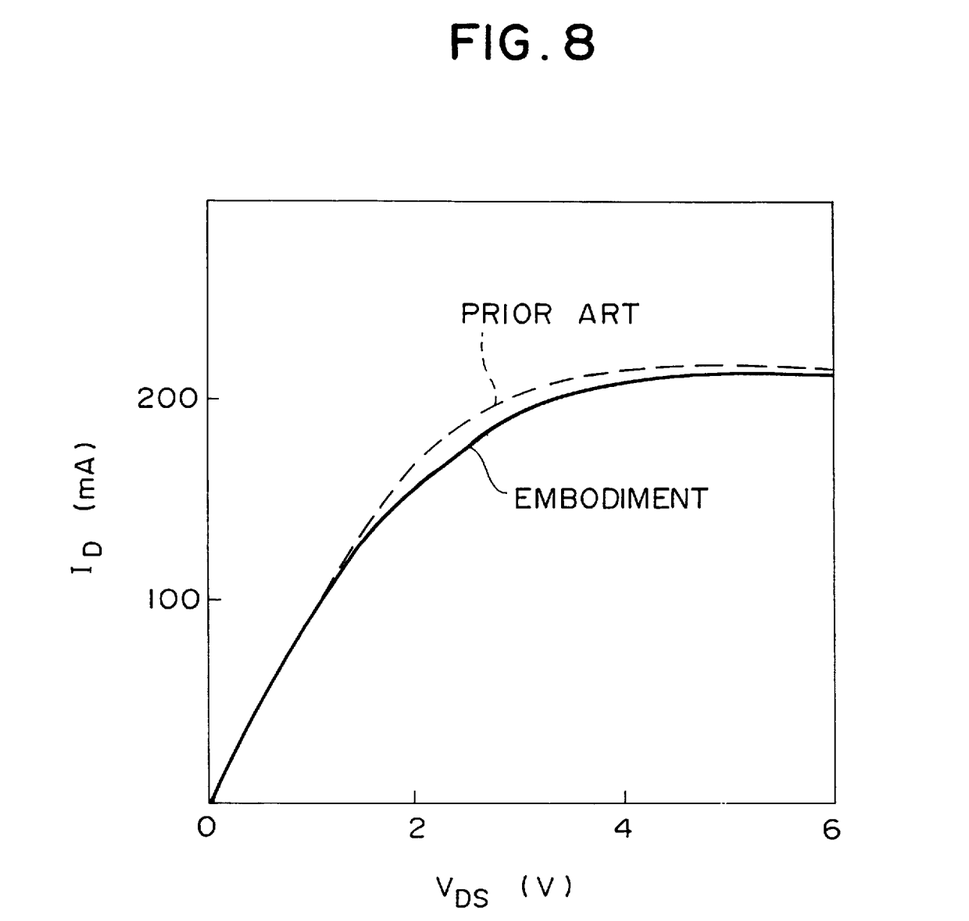
FIG. 8 is a graph showing comparison of the current-voltage characteristics in the embodiments of the present invention and the prior arts.

The electrical conduction characteristics of their polysilicon films and junction interfaces were evaluated from the current-voltage characteristics of VDMOS Tr. cells respectively fabricated on the power IC bonded substrates formed by the first and second embodiments of the present invention, and on the epitaxial substrate shown in FIG. 1. Note that the thicknesses of active layers of both the substrates for each cell are 8 μm, and the polysilicon film on the substrate in each of the first and second embodiments of the present invention is doped with antimony. FIG. 8 shows the respective relationships between drain currents $I_D$ and source-drain voltages $V_{DS}$. As is apparent from FIG. 8, the VDMOS Tr. cells in the embodiments have almost the same output characteristics as those of the VDMOS Tr. cell fabricated on the epitaxial substrate. This result indicates that the electrical conduction characteristics of the polysilicon films on the substrates of the first and second embodiments are sufficiently achieved.

Figure 9A:
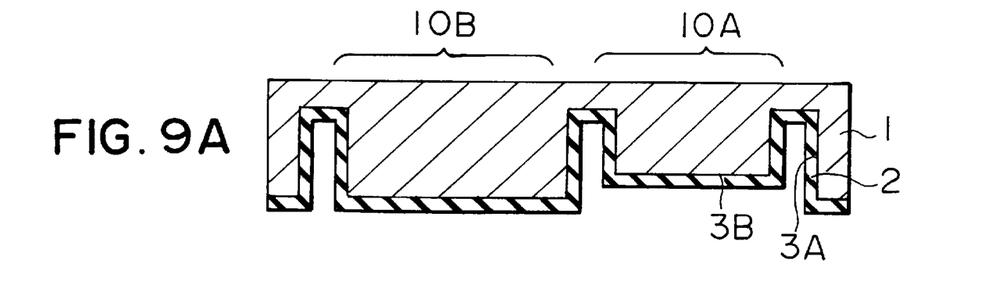
FIGS. 9A to 9C are sectional views respectively showing the sequential steps of a semiconductor chip in order to explain a manufacturing method of the third embodiment of the present invention.

FIGS. 9A to 9C are sectional views respectively showing the sequential steps of a semiconductor chip in order to explain the third embodiment of the present invention. As shown in FIG. 9A, a first n-type monocrystalline silicon substrate 1 having a thickness of about 600 μm and a resistivity of about 1 Ωcm is prepared. By wet etching and RIE (Reactive Ion Etching) using a solution mixture of hydrofluoric acid and nitric acid, first deep grooves 3A for partitioning and isolating first and second functional-device formation regions 10A and 10B are formed in one major surface of the first monocrystalline silicon substrate 1, while a second shallow groove 3B is formed in the first functional-device formation region 10A. The depth of the second shallow groove 3B is set to be 1 μm, and that of each first deep groove 3A is set to be 8 μm. A silicon oxide film 2 having a thickness of about 0.4 μm is formed by thermal oxidization.

Figure 9B:
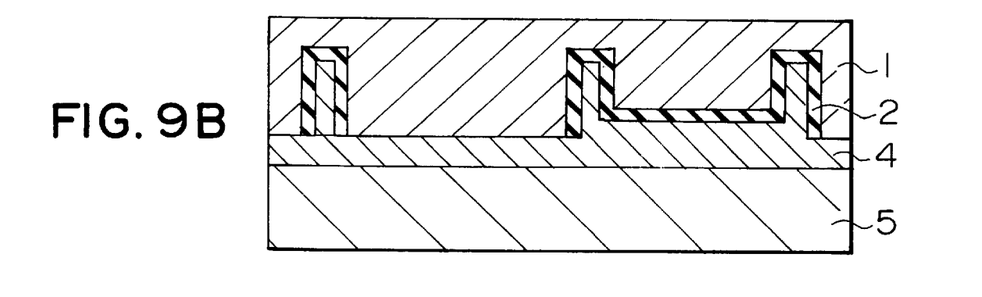

As shown in FIG. 9B, the silicon oxide film 2 which appears on the surface of the first monocrystalline silicon substrate 1 is removed by polishing to expose the first monocrystalline silicon substrate 1 in the second functional-device formation region 10B. A polysilicon film 4 is grown on the surface of the first monocrystalline silicon substrate 1 by CVD to have a thickness of about 3 μm and fill the first and second grooves 3A and 3B. The surface of the polysilicon film 4 is polished and planarized to reduce small corrugations remaining on the surface to 10 nm or less. Then, a second n-type monocrystalline silicon substrate 5 having a thickness of about 600 μm and a resistivity of 0.01 to 0.02 Ωcm is prepared. One major surface of the second monocrystalline silicon substrate 5 and the surface of the polysilicon film 4 on the first monocrystalline silicon substrate 1 are caused to face each other and joined in the outer air at room temperature. The resultant structure is thermally treated at 1,100° to 1,200° C. for about two hours in order to make the junction firm.

Figure 9C:
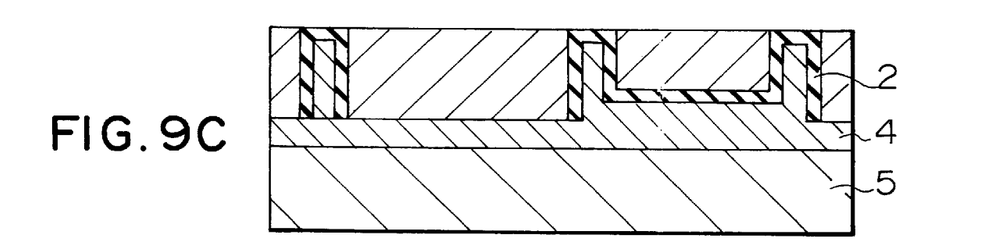

As shown in FIG. 9C, the non-junction surface of the first monocrystalline silicon substrate 1 is ground and polished until the silicon oxide film 2 on the bottom of each first groove 3 is exposed, thereby partitioning the first and second functional-device formation regions 10A and 10B. Protective or control devices are formed in the first functional-device formation region 10A electrically insulated and isolated by the silicon oxide film 2. On the other hand, a vertical power device is formed in the second functional-device formation region where the first and second monocrystalline silicon substrates 1 and 5 are joined to each other through the polysilicon film 4. In this manner, an intelligent power IC is manufactured.

Note that the polysilicon film 4 is made conductive when an n-type impurity heavily doped in the second monocrystalline silicon substrate 5 serving as a support substrate and used as the drain electrode of the power device is diffused during a thermal treatment in joining substrates or during a thermal treatment step in manufacturing a semiconductor device, as in the first embodiment. Owing to this conductivity, the loss of a drain current in the vertical VDMOS can be reduced. When, however, the thickness of the polysilicon film 4 is large (1 μm or more), an impurity is preferably doped in the polysilicon film 4 in advance because the impurity diffused from the second monocrystalline silicon substrate 5 is insufficient. As a method therefor, as described in the first embodiment, the method is employed in which an n-type impurity such as phosphorus, arsenic, or antimony is doped by solid-phase diffusion, vapor-phase diffusion, or ion implantation after grinding and polishing the polysilicon film 4, and the polysilicon film 4 doped with this impurity is polished. The dose of the impurity in the polysilicon film 4 is set such that the resistivity of the polysilicon film 4 is almost equal to that of the second monocrystalline silicon substrate 5. When the first monocrystalline silicon substrate 1 and the second monocrystalline silicon substrate 5 are of a p-type conductivity, boron is doped in the polysilicon film 4.

No void is formed on a power IC bonded substrate fabricated in the third embodiment, as in the first embodiment.

The electrical conduction characteristics of their polysilicon films and junction interfaces were evaluated from the current-voltage characteristics of VDMOS Tr. cells respectively formed on the power IC bonded substrate shown in the third embodiment and on the epitaxial substrate shown in FIG. 1. Consequently, as in the first embodiment, the VDMOS Tr. cell in the third embodiment has almost the same output characteristics as those of the VDMOS Tr. cell fabricated on the epitaxial substrate. This result indicates that the electrical conduction characteristics of the polysilicon film on the substrate of the third embodiment are sufficiently achieved. In addition, the third embodiment has advantages of an easy manufacturing process and a low manufacturing cost, compared to the first and second embodiments.

Figure 10:
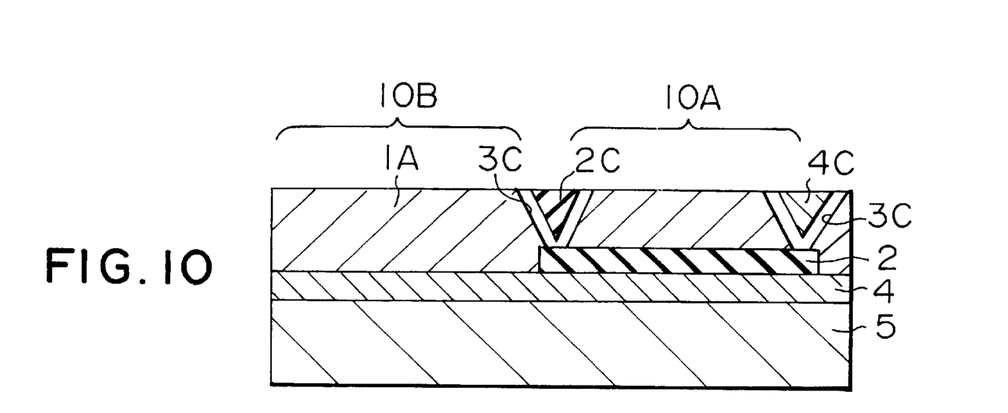
FIG. 10 is a sectional view showing the fourth embodiment of the present invention.

FIG. 10 is a sectional view showing a semiconductor chip in order to explain the fourth embodiment of the present invention. A polysilicon film is formed at a junction portion between the first and second monocrystalline silicon substrates 1A and 5 in the prior art shown in FIG. 3, and an impurity is doped.

First of all, a first n-type monocrystalline silicon substrate 1A having a thickness of about 600 μm and a resistivity of about 1 Ωcm is prepared. Grooves each having a depth of 1 μm are formed in one major surface of the first monocrystalline silicon substrate 1A in a first functional-device formation region 10A by wet etching using a solution mixture of hydrofluoric acid and nitric acid or RIE (Reactive Ion Etching). A silicon oxide film 2 having a thickness of about 1.2 μm is formed by thermal oxidization.

The silicon oxide film 2 is planarized by polishing to expose the first monocrystalline silicon substrate 1A in a second functional-device formation region 10B. A polysilicon film 4 is grown to a thickness of about 3 μm on the surface of the first monocrystalline silicon substrate 1A including the silicon oxide film 2. The surface of the polysilicon film 4 is polished and planarized to reduce small corrugations remaining on the surface to 10 nm or less.

Then, a second n-type monocrystalline silicon substrate 5 having a thickness of about 600 μm and a resistivity of 0.01 to 0.02 Ωcm is prepared. One major surface of the second monocrystalline silicon substrate 5 and the surface of the polysilicon film 4 on the first monocrystalline silicon substrate 1A are caused to face each other and joined in the outer air at room temperature. The resultant structure is thermally treated at 1,100° to 1,200° C. for about two hours in order to make the junction firm.

Thereafter, the non-junction surface of the first monocrystalline silicon substrate 1A is ground and polished to a predetermined thickness. Grooves 3C are formed from the surface of the first monocrystalline silicon substrate 1A so as to contact the peripheral edge of the silicon oxide film 2. After a silicon oxide film 2C is formed on the surface of each groove 3C, the groove 3C is filled with a polysilicon film 4C. Protective or control devices are formed in the first functional-device formation region 10A electrically insulated and isolated by the silicon oxide films 2 and 2C. On the other hand, a vertical power device is formed in the second functional-device formation region 10B where the first and second monocrystalline silicon substrates 1A and 5 are joined to each other through the polysilicon film 4. In this manner, an intelligent power IC is manufactured. Note that a p-type region may be formed to isolate the device formation regions, instead of the grooves.

Note that the polysilicon film 4 is made conductive when an impurity heavily doped in the second monocrystalline silicon substrate 5 serving as a support substrate and used as the drain electrode of the power device is diffused during a thermal treatment in joining substrates or during a thermal treatment step in manufacturing a semiconductor device. Owing to this conductivity, the loss of a drain current in the vertical VDMOS can be reduced. When, however, the thickness of the polysilicon film 4 is large (1 µm or more), an impurity is doped in the polysilicon film 4 in advance because the impurity diffused from the second monocrystalline silicon substrate 5 is insufficient. As a method therefor, as described in the first embodiment, the method is employed in which an n-type impurity such as phosphorus, arsenic, or antimony is doped by solid-phase diffusion, vapor-phase diffusion, or ion implantation after grinding and polishing the polysilicon film 4, and the polysilicon film 4 is polished. The dose of the impurity in the polysilicon film 4 is set such that the resistivity of the polysilicon film 4 is almost equal to that of the second monocrystalline silicon substrate 5. Also in the fourth embodiment, the electrical conduction characteristics between the substrate and the polysilicon film are sufficiently achieved.

What we claimed is:

1. A semiconductor device comprising: a groove formed in a surface of a first semiconductor substrate of one-conductivity type to partition and isolate first and second functional-device formation regions; a first insulating film having a first thickness formed on said surface of said first semiconductor substrate only in said first functional-device formation region and to the edge of the groove; a second insulating film having a second thickness for covering inner walls of the groove; said first thickness being thicker than said second thickness; a filling layer formed on said second insulating film to fill the groove; a polysilicon film of one conductivity type formed on an entire surface including said first insulating film which appears on said surface of said first semiconductor substrate, said second insulating film, and said filling layer, and having a planarized surface; a second semiconductor substrate of one conductivity type joined to said planarized surface of said polysilicon film; a first functional device formed on said first semiconductor substrate in the first functional-device formation region electrically insulated and isolated by said first insulating film, said second insulating film, and said filling layer; and a second functional device formed on said first and second semiconductor substrates in the second functional-device formation region.

2. A device according to claim 1, wherein said second insulating film is constituted by a silicon oxide film and a silicon nitride film.

3. A semiconductor device comprising: a first groove formed in a surface of a first semiconductor substrate of one conductivity type to partition and isolate first and second functional-device formation regions; a second groove which is formed in said surface of said first semiconductor substrate only in said first functional-device formation region and contacts the first groove; said first groove being deeper than said second groove; an insulating film for covering inner walls of the first and second grooves; a filling layer formed on said insulating film to fill the first and second grooves; a polysilicon film of one conductivity type formed on an entire surface including said insulating film which appears on said surface of said first semiconductor substrate, and said filling layer, and having a planarized surface; a second semiconductor substrate of one conductivity type joined to said planarized surface of said polysilicon film; a first functional device formed on said first semiconductor substrate in the first functional-device formation region partitioned by the first and second grooves and electrically insulated and isolated by said insulating film; and a second functional device formed on said first and second semiconductor substrates in the second functional-device formation region.

* * * * *